United States Patent
Nakagawa et al.

(10) Patent No.: US 8,524,617 B2
(45) Date of Patent: Sep. 3, 2013

(54) METHODS FOR MANUFACTURING DIELECTRIC FILMS

(75) Inventors: Takashi Nakagawa, Tokyo (JP); Naomu Kitano, Tokyo (JP); Toru Tatsumi, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 218 days.

(21) Appl. No.: 13/147,990

(22) PCT Filed: Feb. 26, 2010

(86) PCT No.: PCT/JP2010/001304
§ 371 (c)(1),
(2), (4) Date: Oct. 6, 2011

(87) PCT Pub. No.: WO2010/098121
PCT Pub. Date: Sep. 2, 2010

(65) Prior Publication Data
US 2012/0021612 A1 Jan. 26, 2012

(30) Foreign Application Priority Data
Feb. 27, 2009 (JP) ................................. 2009-044986

(51) Int. Cl.
*H01L 21/31* (2006.01)
*H01L 21/469* (2006.01)

(52) U.S. Cl.
USPC ........... 438/785; 438/197; 438/287; 438/585; 257/288; 257/314; 257/368; 257/410

(58) Field of Classification Search
None
See application file for complete search history.

(56) References Cited

U.S. PATENT DOCUMENTS

| 6,903,398 B2 * | 6/2005 | Yamamoto ..................... 257/295 |
| 7,476,916 B2 * | 1/2009 | Tatsumi et al. ................ 257/213 |

(Continued)

FOREIGN PATENT DOCUMENTS

| JP | 2003-008011 A | 1/2003 |
| JP | 2004-214304 A | 7/2004 |

(Continued)

OTHER PUBLICATIONS

Thin Film Hafnium Silicate (HfSiO) Thickness and Composition Measurements by XPS, May 7, 2007, http://www.eaglabs.com/documents/thin-film-hafnium-silicate-hfsio-AN416.pdf.*

(Continued)

*Primary Examiner* — Evan Pert
*Assistant Examiner* — Andres Munoz
(74) *Attorney, Agent, or Firm* — Fitzpatrick, Cella, Harper & Scinto

(57) ABSTRACT

A method for manufacturing a dielectric film having a high dielectric constant is provided.
The method is a method for forming, on a substrate, a dielectric film including a metal oxide containing O and elements A and B, wherein the element A comprises Hf or a mixture of Hf and Zr and the element B comprises Al or Si, which includes the steps of: forming a metal oxide having an amorphous structure which has a molar ratio between element A and element B, $B/(A+B)$ of $0.02 \leq (B/(A+B)) \leq 0.095$ and a molar ratio between element A and O, $O/A$ of $1.0 < (O/A) < 2.0$; and annealing the metal oxide having the amorphous structure at 700° C. or more to form a metal oxide containing a crystal phase with a cubic crystal content of 80% or more.

12 Claims, 10 Drawing Sheets

(56) References Cited

U.S. PATENT DOCUMENTS

| | | |
|---|---|---|
| 2002/0195643 A1 | 12/2002 | Harada |
| 2004/0084736 A1 | 5/2004 | Harada |
| 2004/0135186 A1 | 7/2004 | Yamamoto |
| 2005/0212029 A1 | 9/2005 | Yamamoto |
| 2005/0212031 A1 | 9/2005 | Yamamoto |
| 2007/0096104 A1 | 5/2007 | Tatsumi et al. |
| 2007/0252232 A1 | 11/2007 | Ino et al. |
| 2007/0269955 A2 | 11/2007 | Yamamoto |
| 2008/0017914 A1 | 1/2008 | Natori et al. |
| 2008/0169520 A1* | 7/2008 | Kiyomura et al. ............ 257/411 |
| 2008/0237688 A1* | 10/2008 | Yasuda ........................ 257/316 |
| 2010/0221905 A1* | 9/2010 | Hautala et al. ................ 438/591 |
| 2010/0244192 A1* | 9/2010 | Nakagawa et al. ........... 257/532 |
| 2010/0320520 A1 | 12/2010 | Nakagawa et al. |

FOREIGN PATENT DOCUMENTS

| | | |
|---|---|---|
| JP | 3748218 B2 | 2/2006 |
| JP | 3981094 B2 | 9/2007 |
| JP | 2007-299878 A | 11/2007 |
| JP | 2008-016626 A | 1/2008 |
| WO | 2004/107451 A1 | 12/2004 |
| WO | 2008/108128 A1 | 9/2008 |

OTHER PUBLICATIONS

S. Migita et al., "Design and Demonstration of Very High-k (k~50) HfO2 for Ultra-Scaled Si CMOS," 2008 Symposium on VLSI Technology Digest of Technical Papers, p. 152 (2008).

* cited by examiner (M: Peaks Specific to Monoclinic Crystal)

(M: Peaks Specific to Monoclinic Crystal)

METHODS FOR MANUFACTURING DIELECTRIC FILMS

TECHNICAL FIELD

The invention relates to methods and programs for manufacturing a dielectric film and a semiconductor device with the dielectric film.

BACKGROUND ART

In the development of semiconductor devices having highly integrated elements, each element is made finer, and the operating voltage is reduced. For example, in the field of MONOS (Metal Oxide Nitride Oxide Semiconductor) type nonvolatile semiconductor devices, as elements are made finer, a blocking film for separating a charge retention layer and a gate electrode is required to have a high dielectric constant. Similarly, in the field of FG (Floating Gate) type nonvolatile semiconductor devices, as elements are made finer, an insulating film between a floating electrode and a gate electrode is required to have a high dielectric constant. In the field of the development of advanced CMOS devices, investigations have been made on a technique of reducing gate-leakage current by using a high dielectric constant material to increase the physical thickness of a gate insulating film. Such a high dielectric constant film is also required to be heat-resistant to annealing at 1,000° C. in the process of manufacturing the above semiconductor devices. In addition, such a high dielectric constant film is also required to have high surface flatness in order to reduce fluctuations in the operating voltage of the semiconductor devices.

To increase the relative dielectric constant of dielectric films, methods using $HfO_2$, $ZrO_2$, or $Al_2O_3$, which has a relative dielectric constant higher than that of a conventional $SiO_2$ or $SiN$ film or a $SiON$ film (a combination thereof), for dielectric films have been investigated. Recently, to reduce leakage current associated with a reduction in the dielectric film thickness, investigations have also been made on dielectric films having a laminated structure of $HfO_2$, $ZrO_2$ or $Al_2O_3$ or comprising $HfO_2$ or $ZrO_2$ doped with a metal element.

Methods for forming high dielectric constant films include CVD (Chemical Vapor Deposition) methods, atomic layer adsorption/deposition methods, and sputtering methods. CVD methods have incubation time in the deposition process and therefore present challenges in achieving film-thickness controllability, in-plane uniformity, and reproducibility. On the other hand, sputtering methods have the problem of plasma damage or the formation of an interface layer by oxidation of the treated substrate.

For example, Patent Document 1 discloses a technique of forming a dielectric film with a high dielectric constant by ALD or CVD method, in which the dielectric film is an amorphous film comprising an crystalline dielectric material and amorphous aluminum oxide and having the composition of $Al_xM_{(1-x)}O_y$, wherein M is a metal capable of forming a crystalline dielectric material, such as Hf or Zr, and 0.05<x<0.3. This technique is characterized in that amorphous zircon aluminate with a high relative dielectric constant of 25 to 28 can be obtained. Patent Document 1 also discloses that $ZrO_2$ has a relative dielectric constant of 30.

For example, Patent Document 2 discloses a technique of forming a dielectric film with a high dielectric constant by sputtering, in which $ZrO_2$ is formed by electron cyclotron resonance-assisted sputtering in such a range that the stoichiometric composition is achieved and in such an oxygen feed rate range that the rate of the reduction in the sputtering rate caused by oxidation of the target surface reaches the maximum.

Patent Document 3 discloses that a dielectric film comprising $HfO_2$ doped with nitrogen and yttrium (Y) as a metal element is formed using $HfO_2$ and $Y_2O_2$ ceramic targets as sputtering targets. Patent Document 3 discloses that when an element with a large atomic radius, such as Y, is added to monoclinic $HfO_2$, the cohesive energy of the cubic crystal is reduced so that the cubic crystal is stabilized, which results in the conversion of the $HfO_2$ crystal system from the monoclinic crystal to a tetragonal or cubic crystal, so that an HfYO dielectric film with a high relative dielectric constant of 70 is obtained. It is also disclosed that as oxygen in the monoclinic $HfO_2$ is replaced with nitrogen, the nitrogen content increases, so that the crystal system changes from the monoclinic crystal to a tetragonal, rhombohedral or cubic crystal.

Patent Document 4 discloses a dielectric film comprising $Zr_xSi_{(1-x)}O_{(2-y)}$ ($0.81 \leq x \leq 0.99$, $0.04 \leq y \leq 0.25$) which is formed by a process comprising forming an amorphous film in an atmosphere of a mixture of argon and oxygen by sputtering method using Zr and Si targets and then annealing the amorphous film under an oxygen-containing atmosphere at 750° C. or more to form a dielectric film having a tetragonal crystal.

Non-Patent Document 1 discloses a dielectric film composed of $HfO_2$ formed by RF sputtering method and TiN placed on the surface of the $HfO_2$. The document 3 discloses that when a laminate of $HfO_2$ and TiN is crystallized, $HfO_2$ having a cubic crystal phase is formed so that a dielectric film with a relative dielectric constant of 50 is obtained.

PRIOR ART DOCUMENTS

Patent Documents

Patent Document 1: Japanese Patent Application Laid-Open (JP-A) No. 2004-214304
Patent Document 2: Japanese Patent No. 3748218
Patent Document 3: Japanese Patent No. 3981094
Patent Document 4: JP-A No. 2007-299878

Non-Patent Document

Non-Patent Document 1: Symposium on VLSI technology digest of technical papers. 2008, p. 152.

SUMMARY OF THE INVENTION

Problems to be Solved by the Invention

However, the above techniques have problems as described below.

The technique of doping $ZrO_2$ with 5 to 30% of Al described in Patent Document 1 has a problem in which although a high relative dielectric constant of 25 to 28 is obtained by the amorphous structure, such a relative dielectric constant is lower than 30 which is the relative dielectric constant of $ZrO_2$ having a crystal structure.

The technique of forming $ZrO_2$ with the aid of electron cyclotron resonance described in Patent Document 2 has a problem in which the relative dielectric constant of $ZrO_2$ obtained by annealing at 660° C. to 680° C. is 12, which is significantly lower than that of the dielectric film described in Patent Document 1. The document is also silent on the crystal structure of $ZrO_2$.

The technique of forming an HfYO film described in Patent Document 3 is effective in forming a high dielectric constant film with a relative dielectric constant of 70 but has a problem in which the deposition rate of the dielectric film is extremely low, because the sputtering rate is reduced in the sputtering method using ceramic sputtering targets made of $HfO_2$ and $Y_2O_2$ metal oxides, respectively.

The technique of forming a dielectric film having a tetragonal crystal structure comprising $Zr_xSi_{(1-x)}O_{(2-y)}$ ($0.81 \leq x \leq 0.99$, $0.04 \leq y \leq 0.25$) described in Patent Document 4 has a problem in which the relative dielectric constant of the resulting dielectric film is 20 to 26 which is lower than that of $ZrO_2$ described in Patent Document 1.

As described in non-patent document 1, the technique of forming $HfO_2$ having a cubic crystal by crystallizing a laminate comprising $HfO_2$ formed by RF sputtering and TiN placed on the surface of the $HfO_2$ is effective in forming a high dielectric constant film with a relative dielectric constant of 50 but has a problem in which the deposition rate of the dielectric film is extremely low, because the sputtering rate is reduced in the sputtering method using a ceramic target comprising a $HfO_2$ metal oxide as a sputtering target. In addition, to obtain such a high dielectric constant, it is necessary to perform a process including placing TiN on the $HfO_2$ film and annealing the laminate, which may cause degradation of the film quality by an oxidation reaction at the interface between $HfO_2$ and TiN in the annealing process. It is also disclosed that a relative dielectric constant of 50 is obtained by annealing at 700° C. to 800° C., but the relative dielectric constant is reduced to 30 or less by annealing at 800° C. or more. Therefore, the cubic $HfO_2$ formed from the laminated film of TiN and $HfO_2$ also has the problem of no thermal resistance to annealing at 1,000° C.

The invention has been made in view of the above problems, and an object of the invention is to solve the above problems and to provide a method and a program for manufacturing a dielectric film having a high relative dielectric constant and high thermal resistance to annealing at 1,000° C. without causing a reduction in deposition rate due to a reduction in sputtering rate.

Means for Solving the Problems

As a result of investigations to solve the above problems, the inventors have made the invention based on the finding that a dielectric film having a high relative dielectric constant and being heat-resistant to a high temperature of 1,000° C. can be obtained by forming a metal oxide having a specific composition and an amorphous structure and by annealing the metal oxide.

Specifically, the invention is directed to a method for forming, on a substrate, a dielectric film comprising a metal oxide containing O and elements A and B, wherein the element A comprises Hf or a mixture of Hf and Zr and the element B comprises Al or Si, which includes the steps of:

forming a metal oxide having an amorphous structure which has a molar ratio between element A and element B, $B/(A+B)$ of $0.02 \leq (B/(A+B)) \leq 0.095$ and a molar ratio between element A and O, $O/A$ of $1.0<(O/A)<2.0$; and annealing the metal oxide having the amorphous structure at 700° C. or more to form a metal oxide containing a crystal phase with a cubic crystal content of 80% or more.

In the method of the invention for forming a dielectric film, the step of forming the metal oxide having the amorphous structure preferably includes magnetron-sputtering a metal target for forming the metal oxide layer, under an atmosphere of a mixture of inert gas and reactive gas comprising oxygen in a vacuum chamber, at such a reactive gas feed rate that the molar ratio between element A and O, O/A in the metal oxide can fall within the range of $1.5<(O/A)<2.0$.

The reactive gas feed rate is preferably set to be equal to or less than a feed rate at which the rate of the reduction in the sputtering rate caused by oxidation of the surface of the metal target reaches the maximum.

The pressure in the vacuum chamber is preferably set at $1 \times 10^{-1}$ Pa or less.

The dielectric film preferably has a relative dielectric constant of 40 or more.

The invention is also directed to a method for manufacturing a semiconductor device having a dielectric film as an insulating film, which includes forming the dielectric film by the dielectric film-forming method stated above.

The invention is also directed to a method for manufacturing a nonvolatile semiconductor device including a substrate at least a surface of which comprises a semiconductor layer, a gate electrode formed on the substrate, and laminated gate insulating films sequentially laminated between the substrate and the gate electrode, which includes forming at least one of the laminated gate insulating films by the dielectric film-forming method stated above.

The invention is also directed to a method for manufacturing a nonvolatile semiconductor device including a substrate at least a surface of which comprises a semiconductor layer, a gate electrode formed on the substrate, and a structure having an insulating film, a floating electrode and an insulating film sequentially laminated between the substrate and the gate electrode, which includes forming at least part of the insulating film between the gate electrode and the floating electrode by the dielectric film-forming method stated above.

The invention is also directed to a method for manufacturing a semiconductor device including a substrate at least a surface of which comprises a semiconductor layer, source and drain regions formed on the substrate, and a gate electrode formed on the substrate with an insulating film interposed therebetween, which includes forming the insulating film by the dielectric film-forming method stated above.

The invention is also directed to a manufacturing program of a dielectric film for forming, on a substrate, a dielectric film comprising a metal oxide containing O and elements A and B, wherein the element A comprises Hf or a mixture of Hf and Zr and the element B comprises Al or Si, wherein the program causes a computer to execute the processes of:

forming a metal oxide having an amorphous structure which has a molar ratio between element A and element B, $B/(A+B)$ of $0.02 \leq (B/(A+B)) \leq 0.095$ and a molar ratio between element A and O, $O/A$ of $1.0<(O/A)<2.0$; and annealing the metal oxide having the amorphous structure at 700° C. or more to form a metal oxide containing a crystal phase with a cubic crystal content of 80% or more.

The invention is also directed to a manufacturing program of semiconductor device for manufacturing a semiconductor device having a dielectric film comprising a metal oxide containing O and elements A and B as an insulating film, wherein the element A comprises Hf or a mixture of Hf and Zr and the element B comprises Al or Si, wherein the program causes a computer to execute the processes of:

forming a metal oxide having an amorphous structure which has a molar ratio between element A and element B, B/(A+B) of $0.02 \leq (B/(A+B)) \leq 0.095$ and a molar ratio between element A and O, O/A of $1.0 < (O/A) < 2.0$; and annealing the metal oxide having the amorphous structure at 700° C. or more to form a metal oxide containing a crystal phase with a cubic crystal content of 80% or more.

The invention is also directed to a computer readable recording medium having any of the above manufacturing programs recorded thereon.

Effects of the Invention

The invention makes it possible to obtain a dielectric film having (1) a high relative dielectric constant of 40 or more and (2) thermal resistance to high temperature annealing at 1,000° C. According to the invention, therefore, EOT (Equivalent Oxide Thickness) can be reduced by increasing the dielectric constant, even when the method of the invention for manufacturing a dielectric film is applied to a process having high temperature annealing, such as a method for manufacturing a gate insulating film for a CMOS transistor device; a method for manufacturing a blocking insulating film for a MONOS type nonvolatile semiconductor device; or a method for manufacturing an insulating film between a floating electrode and a gate electrode for a FG type nonvolatile semiconductor device.

MODES FOR CARRYING OUT THE INVENTION

Some embodiments of the invention are described in detail below with reference to the drawings.

The formation of a dielectric film according to the invention will be described using, as an example, a MIS (Metal Insulator Semiconductor) capacitor in which an HfAlO (Hf: element A, Al: element B) film is formed as a dielectric film on a silicon substrate having a silicon oxide film at the surface.

Figure 1:
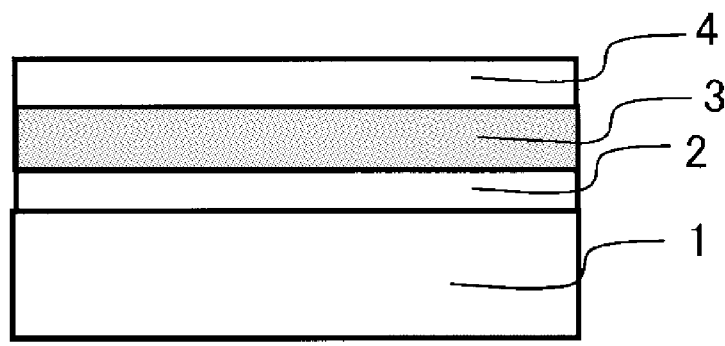
FIG. 1 is a cross-sectional view of a MIS capacitor having a dielectric film formed according to the invention.

As shown in FIG. 1, an HfAlO film having an amorphous structure was deposited on a silicon substrate 1 having a silicon oxide film 2 with a thickness of 3 nm to 5 nm at the surface.

Figure 2:
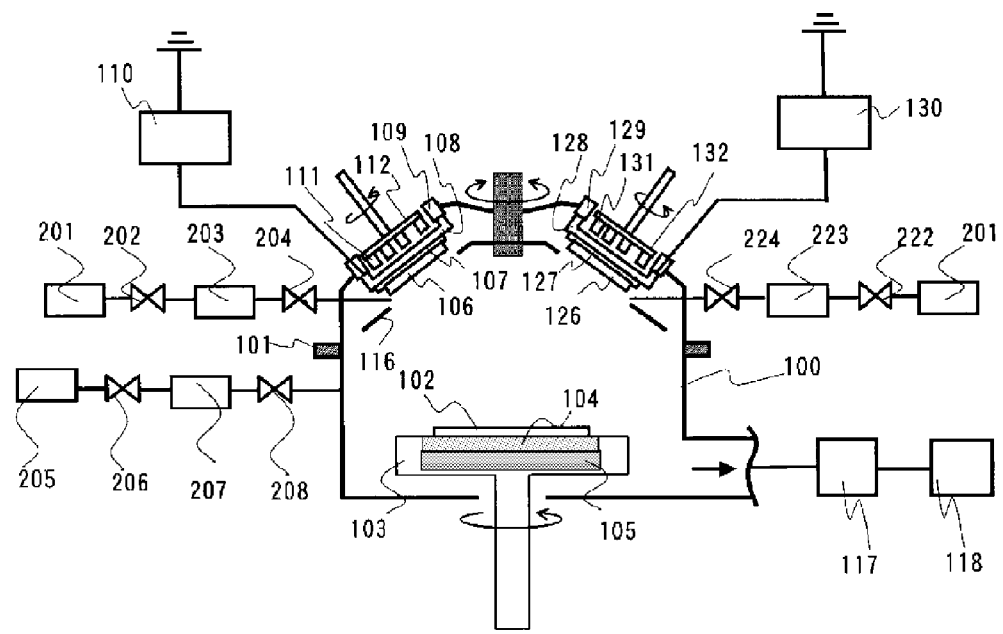
FIG. 2 is a diagram showing an outline of an example of the treatment apparatus used in the step of forming a metal oxide film having an amorphous structure.

FIG. 2 shows an outline of an example of the treatment apparatus used in the step of forming the HfAlO film having an amorphous structure.

A deposition process chamber 100 is capable of being heated at a predetermined temperature by a heater 101. A substrate 102 to be treated is capable of being heated to predetermined temperature through a susceptor 104 incorporated in a substrate support 103 by a heater 105. In view of film thickness uniformity, the substrate support 103 is preferably capable of being rotated at a predetermined rotational speed. In the deposition process chamber 100, targets 106 and 126 are placed at positions facing the substrate 102 to be treated.

The targets 106 and 126 are attached to target holders 108 and 128 through back plates 107 and 127, respectively, which are made of a metal such as Cu. Alternatively, a target assembly of the target 106 or 126 and the back plate 107 or 127 may be in the form of a single part made of a target material, which may be attached as a target. In other words, the target may be configured to be attached to the target holder.

The target holders 108 and 128 made of a metal such as Cu are connected to DC power sources 110 and 130 for applying sputtering discharge power, respectively, and insulated with insulators 109 and 129 from the wall of the deposition process chamber 100 at the ground potential.

Magnets 111 and 131 for magnetron sputtering are placed behind the targets 106 and 126 when seen from the surface to be sputtered. The magnets 111 and 131 are held by magnet holders 112 and 132 and made rotatable by magnet holder rotation mechanisms (not shown). To achieve uniform erosion of the targets, the magnets 111 and 131 are rotated during the discharge.

The targets 106 and 126 are each located at an off-set position obliquely above the substrate 102. Specifically, the center point of the sputtering surface of each of the targets 106 and 126 is located at a position displaced by a predetermined distance from the normal line of the center point of the substrate 102.

A shielding plate 116 is provided between the target 106 or 126 and the substrate 102 being treated so that the deposition of sputtered particles from the powered target 106 or 126 onto the substrate 102 being treated can be controlled.

The targets used include an Hf metal target 106 and an Al metal target 126. The deposition of a dielectric film 3 is performed by applying electric power from the DC power sources 110 and 130 to the metal targets 106 and 126 through the target holders 108 and 128 and the back plates 107 and 127, respectively. In this process, inert gas is introduced from inert gas sources 201 to the process chamber 100 from the vicinity of the target through valves 202 and 222, mass flow controllers 203 and 223 and valves 204 and 224, respectively. Reactive gas comprising oxygen is introduced from an oxygen gas source 205 to the vicinity of the substrate in the process chamber 100 through a valve 206, a mass flow controller 207 and a valve 208. The introduced inert gas and reactive gas are discharged by a vacuum pump 118 through a conductance valve 117.

The substrate temperature was set at 30° C., the Hf target power was set at 600 W, and the Al target power was set in the range of 0 W to 300 W. Using Ar as the inert gas, the deposition was performed at an Ar feed rate of 60 sccm and a reactive gas (oxygen) feed rate of 0 sccm to 40 sccm.

Figure 3:
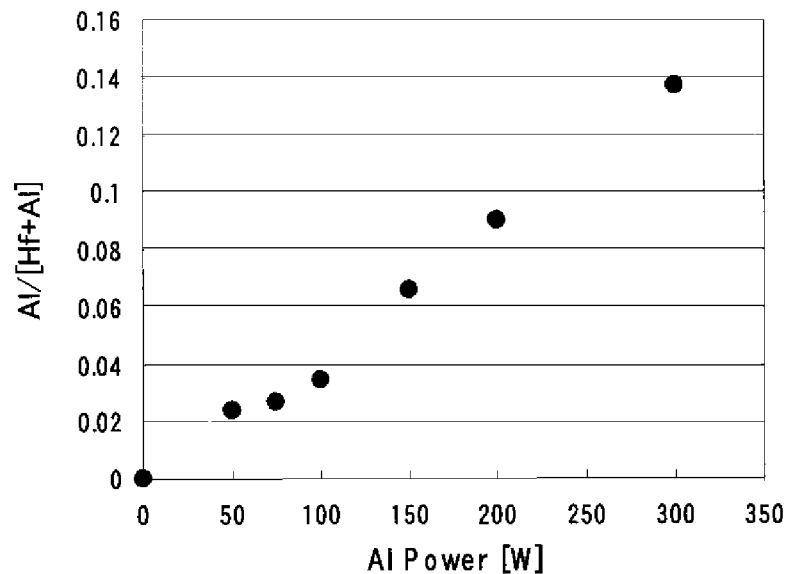
FIG. 3 is a graph showing the Al target power dependence of the Al/(Hf+Al) molar ratio of an HfAlO film.

In this process, the Al/(Hf+Al) molar ratio of the HfAlO film was controlled by controlling the power applied to the Al target. FIG. 3 shows the Al target power dependence of the Al/(Hf+Al+N) molar ratio of an HfAlON film. The composition was evaluated by XPS (X-ray Photoelectron Spectroscopy) analysis. Thus, it is demonstrated that the Al/(Hf+Al) molar ratio can be controlled in the range of 0 to 0.14 by controlling the Al target power. In addition, the O/A molar ratio was controlled to be in the range of 1.0<(O/A)<2.0 by controlling the oxygen feed rate.

An HfAlO film and an Al-free $HfO_2$ film each with a thickness of 5 nm to 25 nm were deposited using the deposition process described above.

The deposited HfAlO and $HfO_2$ films were each annealed in a nitrogen atmosphere at a temperature in the range of 500° C. to 1,000° C., so that the films are each crystallized to form a dielectric film 3.

A 10 nm thick TiN film 4 was then deposited on the dielectric film 3 by sputtering method. Alternatively, the annealing for crystallization may be performed after the deposition of the TiN film 4 on the dielectric film 3.

The TiN film 4 was then processed into the desired size using lithography and RIE (Reactive Ion Etching) techniques, so that a MIS capacitor structure was formed. The electrical properties of the product were evaluated using the silicon substrate 1 and the TiN film 4 as lower and upper electrodes, respectively.

Figure 4:
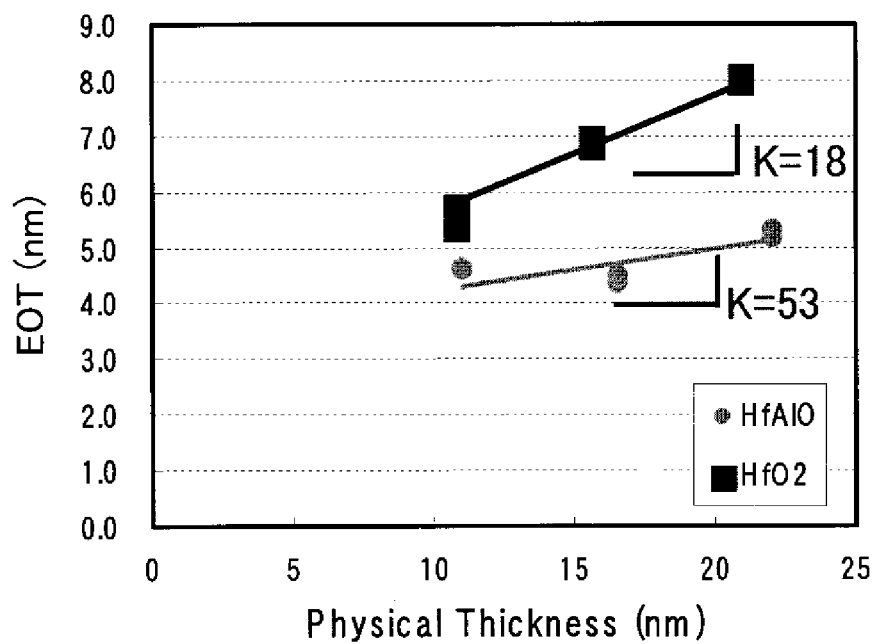
FIG. 4 is a graph showing the relationship between the EOT and physical thickness of the MIS capacitor in FIG. 1.

FIG. 4 shows the relationship between the equivalent oxide thickness (EOT) and the physical thickness of the HfAlO film (the Al/(Hf+Al) molar ratio=0.035) and the $HfO_2$ film. All the samples were crystallized by annealing at 1,000° C.

Now, a description is given of the equivalent oxide thickness (EOT). The equivalent oxide thickness refers to the electrical thickness of an insulating film, which is calculated backward from the capacity assuming that the insulating film was made of silicon oxide regardless of the type of the insulating film. Specifically, the equivalent oxide thickness is expressed by formula (1) below.

$$d_e = d_h \times (\epsilon_0 / \epsilon_h) \quad (1)$$

wherein $d_e$ represents the equivalent oxide thickness, $d_h$ represents the thickness of the insulating film, $\epsilon_0$ represents the relative dielectric constant of the silicon oxide film, and $\epsilon_h$ represents the relative dielectric constant of the insulating film.

Formula (1) indicates that if the insulating film is made of a material having a dielectric constant $\epsilon_h$ higher than the dielectric constant $\epsilon_0$ of the silicon oxide film, the equivalent oxide thickness $d_e$ is equal to the thickness of a silicon oxide film whose thickness is smaller than the thickness $d_h$ of the insulating film. For reference, the relative dielectric constant $\epsilon_0$ of the silicon oxide film is about 3.9. For example, therefore, if a film made of a material with a high dielectric constant $\epsilon_h$ of 39 has a physical thickness $d_h$ of 15 nm, it has an equivalent oxide thickness (electrical thickness) $d_e$ of 1.5 nm, which means that the insulating film can significantly reduce the leakage current, while it has a capacity equivalent to that of a 1.5 nm thick silicon oxide film.

FIG. 4 shows that an HfAlO film with a physical thickness of 22 nm has an EOT of 5.3 nm and therefore the EOT can be reduced using the HfAlO film as compared with using an $HfO_2$ film with a physical thickness of 21 nm (EOT=8.1 nm).

The drawing also shows the relative dielectric constant derived from the slope of the relationship between the EOT and the physical thickness. From FIG. 4, it has been found that the relative dielectric constant of the HfAlO film, which is 53, is significantly greater than that of the $HfO_2$ film, which is 18.

Figure 5:
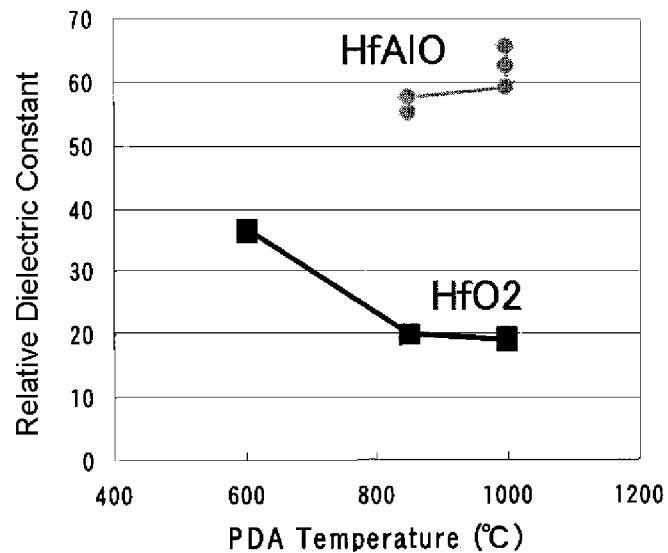
FIG. 5 is a graph showing the relationship between the relative dielectric constant of the MIS capacitor in FIG. 1 and the annealing temperature.

Next, FIG. 5 shows the annealing temperature dependence of the relative dielectric constant of the HfAlO film and the $HfO_2$ film. FIG. 5 indicates that the relative dielectric constant of the Al-free $HfO_2$ film is reduced to 20 or less when the annealing temperature is 850° C. or more, but the relative dielectric constant of the Al-containing HfAlO film is 50 or more even when the annealing temperature is 850° C. or more. This result indicates that the Al-free $HfO_2$ film is not thermally resistant to annealing at 850° C. or more and that when Al is added, heat resistance to high temperature annealing at 1,000° C. is obtained.

Figure 6:
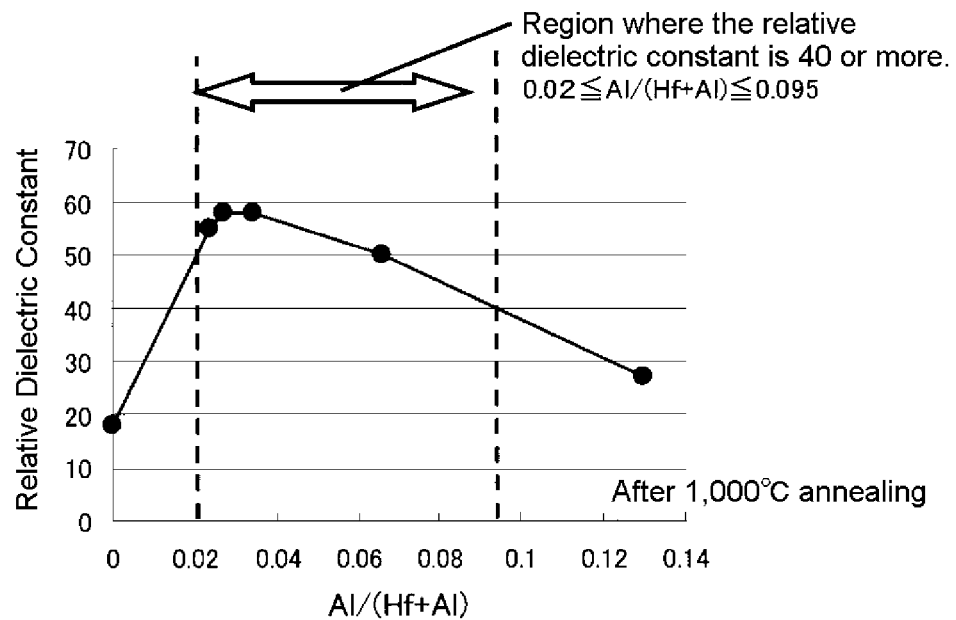
FIG. 6 is a graph showing the relationship between the relative dielectric constant and dielectric film composition of the MIS capacitor in FIG. 1.

FIG. 6 shows the relationship between the relative dielectric constant and the Al/(Hf+Al) molar ratio of the HfAlO film crystallized by annealing at 1,000° C. FIG. 6 indicates that a relative dielectric constant of 40 or more is obtained when the Al/(Hf+Al) molar ratio is in the range of from 0.02 to 0.095. Therefore, the HfAlO film needs to have an Al/(Hf+Al) molar ratio of 0.02 to 0.095 and preferably has an Al/(Hf+Al) molar ratio of 0.02 to 0.07 so that a significant thin film effect can be obtained in terms of EOT.

Figure 7:
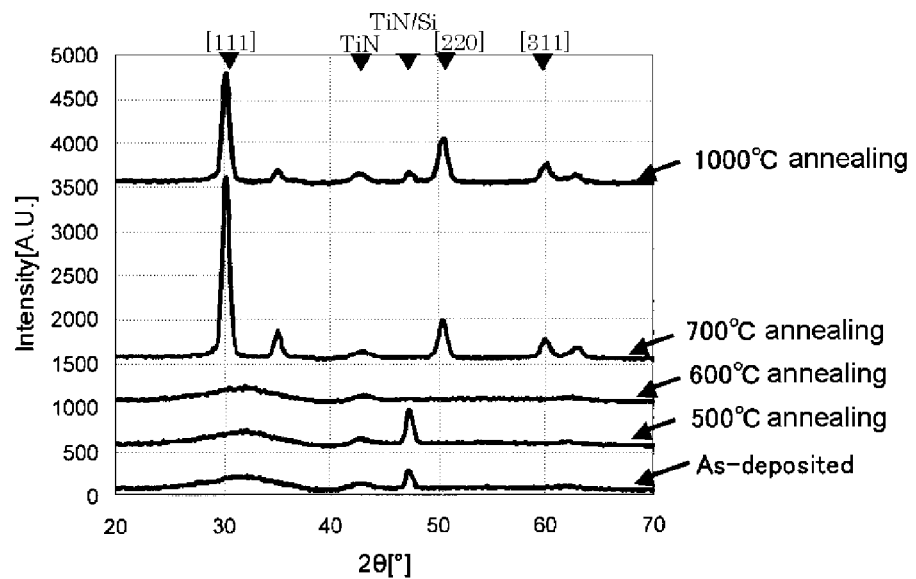
FIG. 7 is a graph showing the relationship between the XRD spectrum of a dielectric film and the annealing temperature.

Next, FIG. 7 shows the annealing temperature dependence of the X-ray diffraction spectrum of an HfAlO film with an Al/(Hf+Al) molar ratio of 0.035. FIG. 7 indicates that the HfAlO film has an amorphous structure in the range from the as-deposited state to the state annealed at a temperature of 600° C. and is crystallized by annealing at a temperature of 700° C. or more. The spectra show [111], [220] and [311] peaks at 2θ angles of about 30°, about 50° and about 60°, respectively, which indicate cubic and tetragonal crystal orientations. The mixing ratio of the cubic and tetragonal crystals was evaluated from the XRD spectrum. As a result, the cubic crystal content was determined to be 80% or more. Therefore, the dielectric film according to the invention is fully effective and advantageous, when it has a cubic phase as the major crystal phase and the cubic crystal content is 80% or more.

Figure 8:
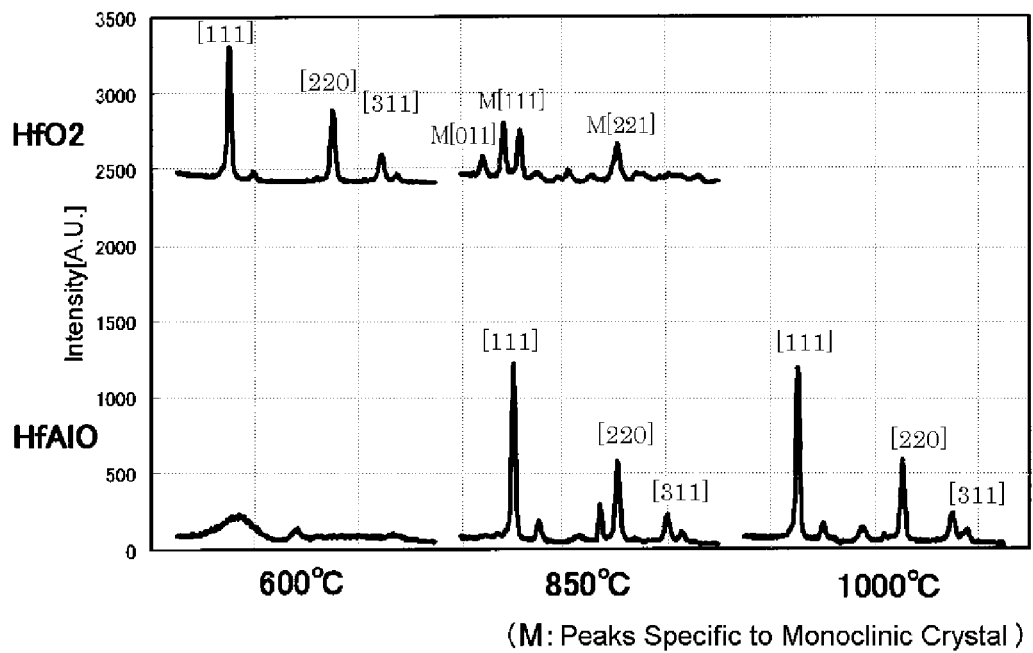
FIG. 8 is a graph showing the XRD spectra of a dielectric film.

Next, the annealing temperature dependence of the crystal structures of the $HfO_2$ film and the HfAlO film (with an Al/(Hf+Al) molar ratio of 0.035) was evaluated by X-ray diffraction method. FIG. 8 shows each X-ray diffraction spectrum. FIG. 8 indicates that when annealed at 600° C., the $HfO_2$ film has a crystal structure composed mainly of a cubic crystal, but when annealed at 850° C., it has a different crystal structure composed mainly of a monoclinic crystal. In contrast, it is found that even when the annealing temperature is 850° C., the HfAlO film still has a crystal structure composed mainly of a cubic crystal. Therefore, it is suggested that the increase in the dielectric constant and heat resistance of the HfAlO film, which contains Al, is related to the crystal phase.

Figure 9:
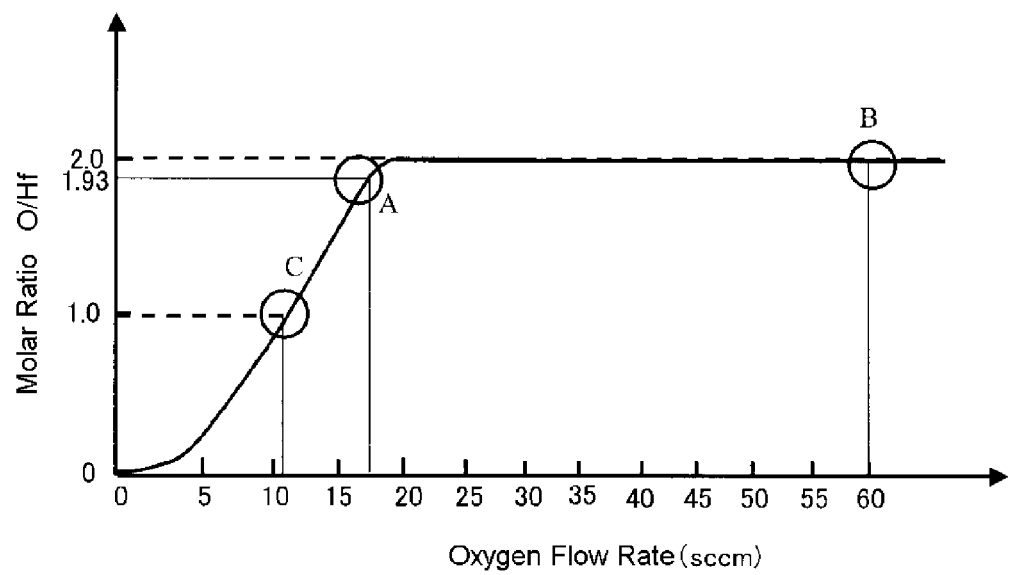
FIG. 9 is a graph showing the relationship between the molar ratio of oxygen contained in a dielectric film and the oxygen feed rate in the deposition process.

Next, FIG. 9 shows the relationship between the O/Hf molar ratio of the deposited $HfO_2$ film and the oxygen flow rate during the deposition. The oxygen molar ratio was measured by XPS. FIG. 9 indicates that in the region where the oxygen flow rate is 20 sccm or more, oxygen has a molar ratio of 2.0 which is a stoichiometric ratio.

Figure 10:
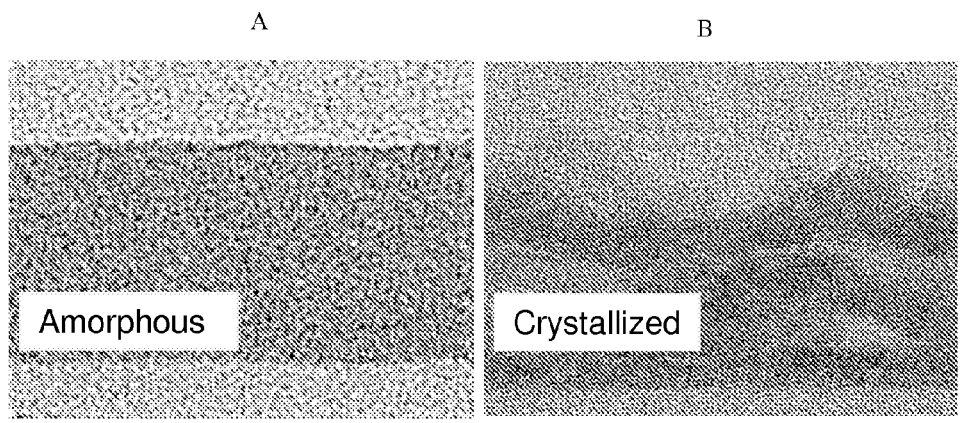
FIG. 10 is a photograph showing TEM images of the cross-section of a dielectric film.

Next, FIG. 10 shows TEM images of the cross-section of $HfO_2$ metal oxide films formed at oxygen flow rates of 18 sccm (point A) and 60 sccm (point B), respectively, in FIG. 9. It is apparent from FIG. 10 that the $HfO_2$ obtained under the A conditions is amorphous and has high surface flatness. In contrast, it is found that the $HfO_2$ obtained under the B conditions is crystallized and significantly degraded in flatness.

Figure 11:
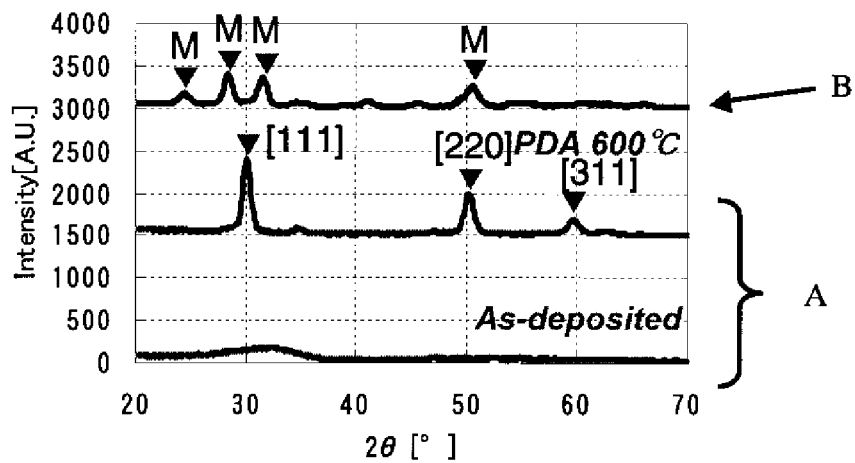
FIG. 11 is a graph showing the XRD spectra of a dielectric film.

FIG. 11 shows the X-ray diffraction spectra of the $HfO_2$ formed under the A and B conditions, respectively. The drawing also shows the X-ray diffraction spectrum of the $HfO_2$ that is formed under the A conditions and annealed at 600° C. In the drawing, M indicates peaks specific to the monoclinic crystal. It is apparent from FIG. 11 that the $HfO_2$ obtained under the A conditions is amorphous in the as-deposited state and crystallized into a phase composed mainly of a cubic crystal when annealed at 600° C. In contrast, it is found that the $HfO_2$ obtained under the B conditions has a monoclinic crystal phase. As a result of the measurement of each relative dielectric constant (k), the $HfO_2$ obtained under the A conditions was determined to have a k of 28, while the $HfO_2$ obtained under the B conditions was determined to have a k of 17. The dielectric film was formed under the conditions where the oxygen flow rate provided an O/Hf molar ratio of 1.0 in FIG. 9 (C conditions). As a result of the evaluation of the electrical properties, the dielectric film was found to increase the leakage current. It is apparent therefore that in order to obtain a crystal phase having a high relative dielectric constant and composed mainly of a cubic crystal according to the invention, it is important that the process should include forming an amorphous film with an O/Hf molar ratio in the range of 1.0<O/Hf<2.0 and then annealing the film to crystallize it into a cubic crystal.

Figure 12:
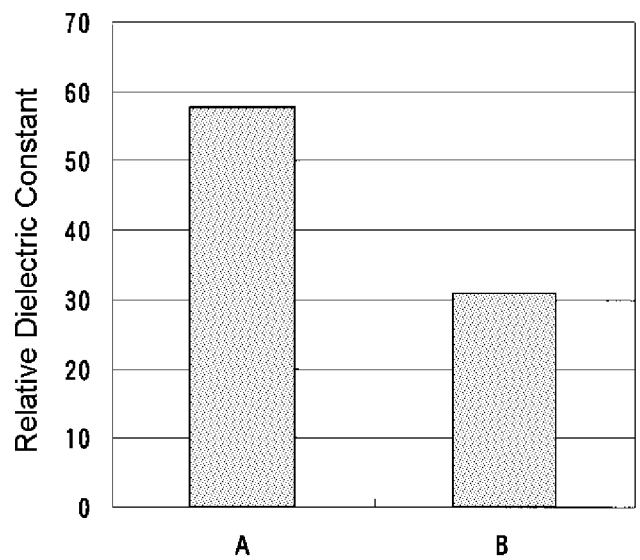
FIG. 12 is a graph showing the relationship between the relative dielectric constant of a dielectric film and the deposition conditions.

Next, FIG. 12 shows the relationship between the conditions of the deposition of the Al-containing HfAlO films and their relative dielectric constants. FIG. 12 indicates that the HfAlO film formed under the B conditions in FIG. 9 has a relative dielectric constant of 30, while the HfAlO film formed under the A conditions has a relative dielectric constant of 58, which is significantly larger. Therefore, it has been demonstrated that a high dielectric constant HfAlO film can be obtained by a process including forming an amorphous HfAlO film at such an oxygen flow rate that the O/Hf molar ratio falls within the range of 1.0<O/Hf<2.0 and then annealing the film to crystallize it into a crystal structure composed mainly of a cubic crystal.

Figure 13:
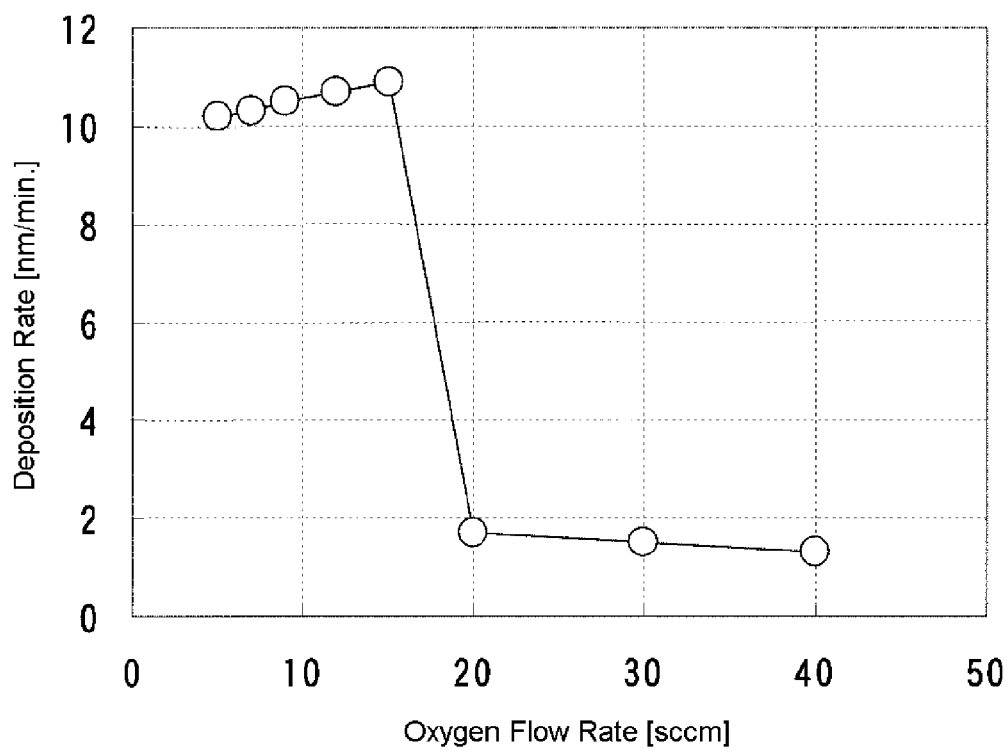
FIG. 13 is a graph showing the relationship between the deposition rate and the oxygen feed rate in the step of depositing a dielectric film.

Next, FIG. 13 shows the oxygen flow rate dependence of the deposition rate of the HfAlO film. FIG. 13 indicates that the deposition rate is 2 nm/minute or less in the region where the oxygen flow rate is 20 sccm or more, while the deposition rate significantly increases to 10 nm/minute or more in the region where the oxygen flow rate is less than 20 sccm. This is because when the oxygen feed rate reaches 20 sccm, oxidation of the metal target surface occurs to reduce the sputtering rate. Therefore, it is indicated that according to the invention, the formation of the dielectric film can be performed without a reduction in deposition rate.

Next, a study was performed on the relationship between the in-plane uniformity of the thickness of the dielectric film being formed and the pressure in the vacuum chamber during deposition. As a result, it was found that a uniformity of ±1% or less can be obtained in the region where the pressure in the vacuum chamber is $1\times10^{-1}$ Pa or less.

While the embodiment described above employs, as the dielectric film, an HfAlO film in which Al is the element B, it has been found that the same advantageous effect is obtained also when an HfSiO film is formed, which contains Si as the element B.

While the embodiment described above employs, as the dielectric film, an HfAlO film in which Hf is the element A, it has been found that the same advantageous effect is obtained also when an HfZrAlO film or an HfZrSiO film is formed, which contains Hf and Zr as the element A.

As is evident from the above, the process for producing a dielectric film having a relative dielectric constant of 40 or more and being heat-resistant to high temperature annealing at 1,000° C. needs to include: forming a metal oxide having an amorphous structure, wherein the metal oxide contains O and elements A and B, wherein the element A comprises Hf or a mixture of Hf and Zr and the element B comprises Al or Si, and concerning the elements A and B, the molar ratio between element A and element B, B/(A+B) is in the range of $0.02 \leq (B/(A+B)) \leq 0.095$, and the molar ratio between element A and O, O/A is in the range of 1.0<(O/A)<2.0; and annealing the metal oxide at 700° C. or more so that a dielectric film containing a crystal phase composed mainly of a cubic crystal can be formed.

The step of forming a metal oxide having an amorphous structure preferably includes magnetron-sputtering a metal target containing a metal material for forming the metal oxide layer, under an atmosphere of a mixture of inert gas and reactive gas comprising oxygen in a vacuum chamber, at such a reactive gas feed rate that the O/A molar ratio of the metal oxide can fall within the range of from 1.5<(O/A)<2.0. Additionally, in order to prevent a reduction in deposition rate, the reactive gas feed rate is preferably set to be equal to or less than a feed rate at which the rate of the reduction in the sputtering rate caused by oxidation of the surface of the metal target reaches the maximum. Additionally, in order to form a dielectric film with a thickness uniformity of ±1% or less, the pressure in the vacuum chamber is preferably set at $1\times10^{-1}$ Pa or less during the deposition.

While cases where the dielectric film is formed on a silicon oxide film have been described above, such cases are non-limiting, and the method of the invention is also fully effective in forming a blocking film for a MONOS type nonvolatile memory device, in forming an insulating film between floating and gate electrodes for a FG type nonvolatile memory device, or in forming part of a MOS transistor.

Specifically, the method of the invention may be applied to methods for manufacturing a semiconductor device having a dielectric film as an insulating film. Examples of such methods include the following:

(1) a method for manufacturing a nonvolatile semiconductor device including a substrate at least the surface of which comprises a semiconductor layer, a gate electrode formed on the substrate, and laminated gate insulating films sequentially laminated between the substrate and the gate electrode, the method including forming at least one of the laminated gate insulating films by the method of the invention;

(2) a nonvolatile semiconductor device including a substrate at least the surface of which comprises a semiconductor layer, a gate electrode formed on the substrate, and a structure having an insulating film, a floating electrode and an insulating film sequentially laminated between the substrate and the gate electrode, wherein at least part of the insulating film between the gate electrode and the floating electrode is the dielectric film formed according to the invention; and (3) a method for manufacturing a semiconductor device including a substrate at least the surface of which comprises a semiconductor layer, source and drain regions formed on the substrate, and a gate electrode formed on the substrate with an insulating film interposed therebetween, the method including forming the insulating film by the method of the invention.

Next, a description is given of the manufacturing program of the invention.

The manufacturing program of the invention is directed to: a program for forming, on a substrate, a dielectric film comprising a metal oxide containing O and elements A and B, wherein the element A comprises Hf or a mixture of Hf and Zr and the element B comprises Al or Si; and a program for manufacturing a semiconductor device having, as an insulator film, a dielectric film comprising a metal oxide containing O and elements A and B, wherein the element A comprises Hf or a mixture of Hf and Zr and the element B comprises Al or Si.

The manufacturing program of the invention includes the procedures of:

forming a metal oxide having an amorphous structure which has a molar ratio between element A and element B, B/(A+B) of $0.02 \leq (B/(A+B)) \leq 0.095$ and a molar ratio between element A and O, O/A of $1.0 < (O/A) < 2.0$; and annealing the metal oxide having the amorphous structure at 700° C. or more to form a metal oxide containing a crystal phase with a cubic crystal content of 80% or more.

Figure 18:
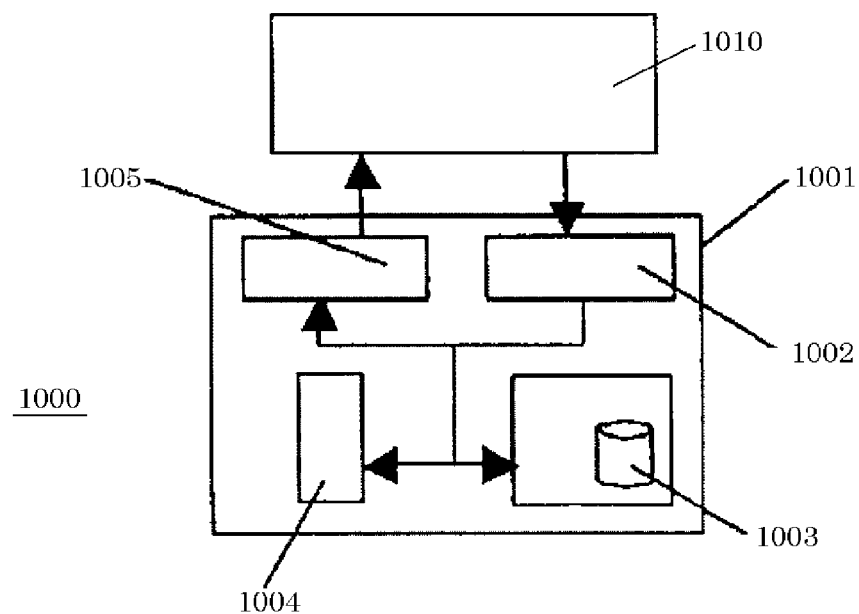
FIG. 18 is a block diagram illustrating a controller.

FIG. 18 is a block diagram illustrating a process controller for executing the procedures, which is typically installed in the treatment apparatus shown in FIG. 2.

As shown in FIG. 18, the treatment apparatus 1010 includes a process controller 1000. The process controller 1000 receives an input signal from the treatment apparatus 1010 and outputs instructions to the treatment apparatus 1010 based on the manufacturing program of the invention. The process controller 1000 includes general basic units of a computer 1001, specifically, an input unit 1002, a storage unit 1003 for storing the program and data, a processor (CPU) 1004, and an output unit 1005, and controls the treatment apparatus 1010.

According to the program, the processor 1004 controls each unit and performs various kinds of arithmetic processing. The storage unit 1003 includes HDD or ROM for preliminarily storing various programs and parameters and RAM or the like for serving as a work area and temporarily storing programs and data. The input unit 1002 has the function of inputting data from the treatment apparatus 1010 and enables external input of instructions.

The manufacturing program of the invention is stored in the storage unit 1003 of the controller 1000 and read out and executed by the processor 1004 when the operation starts.

The manufacturing program of the invention is recorded on a computer (PC) -readable recording medium and installed onto the storage unit 1003 of the controller 1000. Examples of the recording medium include a magnetic recording medium such as a Floppy (registered trademark) disk or ZIP (registered trademark); a magneto-optical recording medium such as MO; an optical disc such as CD-R, DVD-R, DVD+R, DVD-RAM, DVD+RW (registered trademark), or PD; a flash memory type medium such as Compact Flash (registered trademark), Smart Media (registered trademark), Memory Stick (registered trademark), or an SD card; and a removable disc such as Micro Drive (registered trademark) or Jaz (registered trademark).

EXAMPLES

Example 1

Co-Sputtering Example

A first example of the invention is described in detail with reference to the drawings.

Figure 14:
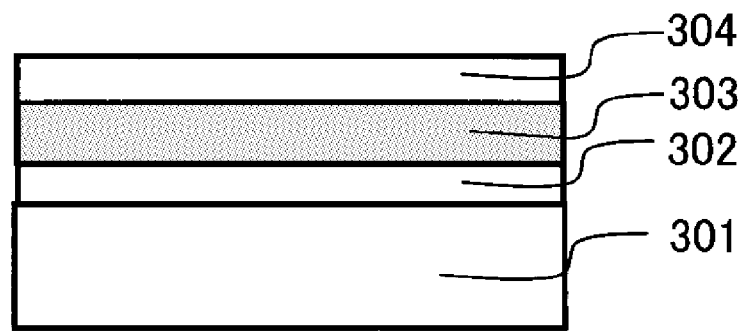
FIG. 14 is a diagram showing the cross-section of a MIS capacitor in Example 1.

FIG. 14 is a diagram showing a MIS capacitor having a dielectric film formed by the method of the invention. An HfAlO film having an amorphous structure was deposited by sputtering method on a silicon substrate 301 having a silicon oxide film 302 with a thickness of 3 nm to 5 nm at the surface. The targets used were Hf and Al metal targets, and argon, oxygen and nitrogen were used as sputtering gas.

The substrate temperature, the target power, the sputtering gas pressure, the Ar gas flow rate, and the oxygen gas flow rate may be appropriately determined in the ranges of 27° C. to 600° C., 50 W to 1,000 W, 0.02 Pa to 0.1 Pa, 1 sccm to 200 sccm, and 1 sccm to 100 sccm, respectively.

In this example, the deposition was performed at a substrate temperature of 30° C., a Hf target power of 600 W, an Al target power of 50 W to 500 W, a sputtering gas pressure of 0.03 Pa, and an Ar gas flow rate of 25 sccm. In order to deposit an HfAlO film having an amorphous structure, the oxygen feed rate was set so that the O/A molar ratio shown in FIG. 9 would fall within the range of $1.0 < (O/A) < 2.0$.

An HfAlO film with a thickness of 5 nm to 25 nm and an Al/(Hf+Al) molar ratio of $0 \leq Al/(Hf+Al) \leq 0.20$ was formed using the deposition process described above.

A TiN film 304 with a thickness of 10 nm was then formed on the HfAlO film by sputtering method. The target used was a Ti metal target, and argon and nitrogen were used as sputtering gas.

The substrate temperature, the target power, the sputtering gas pressure, the Ar gas flow rate, and the nitrogen gas flow rate may be appropriately determined in the ranges of 27° C. to 600° C., 50 W to 1,000 W, 0.02 Pa to 0.1 Pa, 1 sccm to 200 sccm, and 1 sccm to 50 sccm, respectively.

In this example, the deposition was performed at a substrate temperature of 30° C., a Ti target power of 750 W, a sputtering gas pressure of 0.03 Pa, an Ar gas flow rate of 30 sccm, and a nitrogen gas flow rate of 10 sccm.

While a TiN film 304 was deposited in this example, Ti, TaN, W, Pt, Ru, Al, or Si may also be used as needed. Alternatively, a film of a material selected from the group consisting of these materials may be deposited.

In a nitrogen atmosphere, the HfAlO film was then annealed at a temperature of 700° C. for 2 minutes or at a temperature of 1,000° C. for 10 seconds, so that it was crystallized to form a dielectric film 303. While the annealing was performed after the deposition of the TiN film 304 in this example, the annealing may be performed before the deposition of the TiN film 304. While the annealing was performed in a nitrogen atmosphere in this example, oxygen and inert gas such as Ar may be used as needed. Alternatively, the annealing may be performed in an atmosphere selected from the group consisting of these atmospheres.

The TiN film 304 was then processed into the desired size by lithography and RIE techniques, so that a MIS capacitor structure was formed.

The relative dielectric constant of the dielectric film 303 formed as described above was evaluated. As a result, it was demonstrated that a relative dielectric constant of 40 or more was obtained when the Al/(Hf+Al) molar ratio of the HfAlO film was in the range of from 0.02 to 0.095. The dielectric film 303 annealed at 700° C. or more was measured by X-ray diffraction. As a result, the dielectric film 303 was found to have a crystal structure composed mainly of a cubic crystal.

In this example, therefore, it has been demonstrated that a high dielectric constant film having a relative dielectric constant of 40 or more and being heat-resistant to high temperature annealing at 1,000° C. can be obtained by performing the steps of forming a metal oxide having an amorphous structure which is represented by HfAlO with an Al/(Hf+Al) molar ratio of $0.02 \leq (Al/(Hf+Al)) \leq 0.095$ and annealing the metal oxide having the amorphous structure at 700° C. or more to form a metal oxide containing a crystal phase composed mainly of a cubic crystal.

In this example, it has also been demonstrated that the same advantageous effect can be obtained when HfSiO, which contains Si as the element B, is formed as the dielectric film 303.

In this example, it has also been demonstrated that the same advantageous effect can be obtained when HfZrAlO and HfZrSiO, which contain Hf and Zr as the element A, are formed as the dielectric film 303.

It has also been demonstrated that the same advantageous effect can be obtained in a structure where the TiN film 304 is not deposited on the dielectric film 303.

It has also been demonstrated that the same advantageous effect can be obtained using a material selected from the group consisting of Ti, TaN, W, Pt, Ru, Al, and Si in place of the TiN film 304.

Example 2

Example Applied to Gate Insulating Film

A second example of the invention is described in detail with reference to the drawings.

Figure 15:
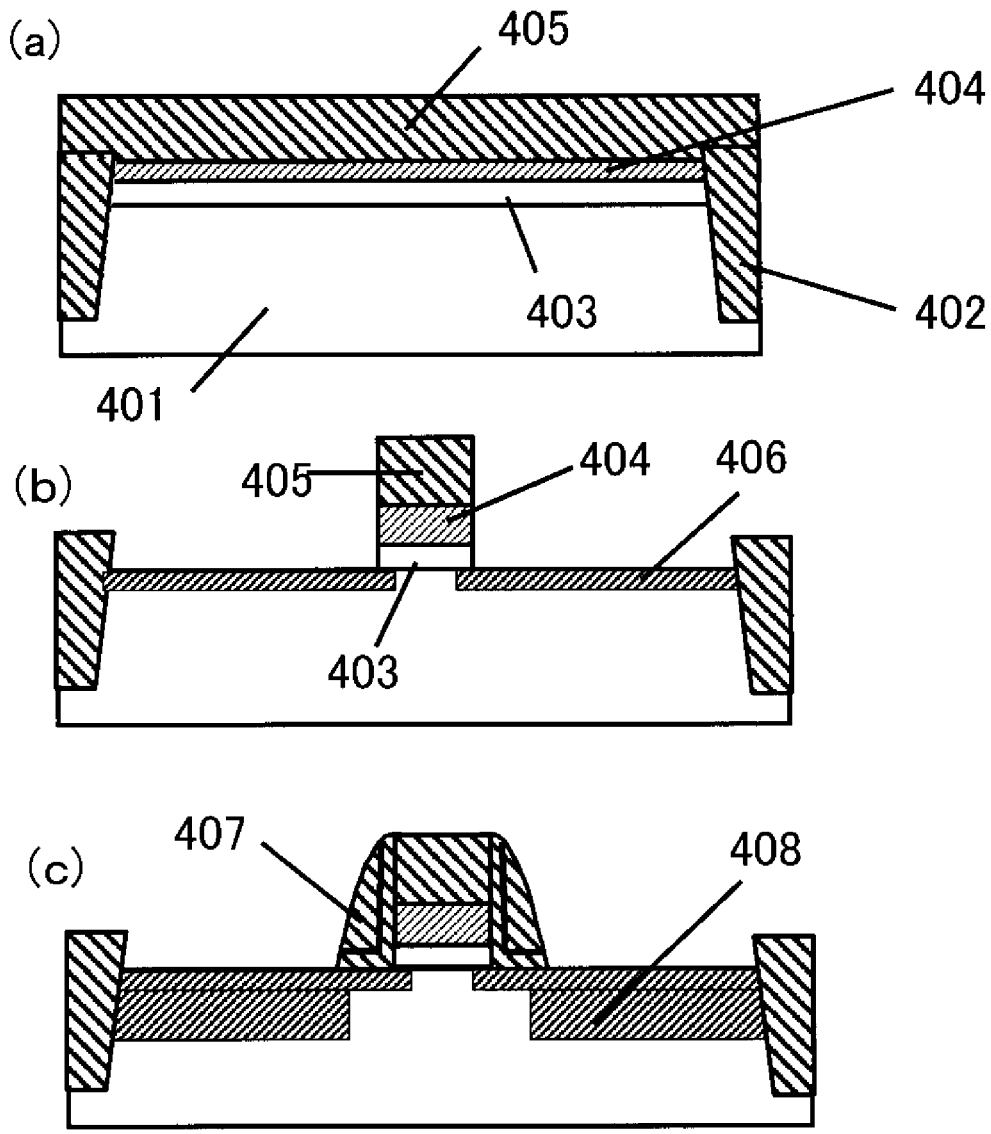
FIG. 15 is a diagram showing the steps of a method of manufacturing a semiconductor device in Example 2.

FIGS. 15(a) to 15(c) are diagrams showing the steps of the method of the second example of the invention for manufacturing a semiconductor device.

As shown in FIG. 15(a), an isolation region 402 was first formed on the surface of a silicon substrate 401 using STI (Shallow Trench Isolation) technique. Subsequently, a silicon oxide film 403 with a thickness of 1.8 nm was formed on the isolated surface of the silicon substrate 401 by thermal oxidation method. An HfAlO film with a thickness in the range of 1 nm to 10 nm was then formed by the same method as in Example 1. Subsequently, the HfAlO film was annealed at 1,000° C. for 10 seconds in a nitrogen atmosphere, so that it was crystallized to form a dielectric film 404.

Figure 16:
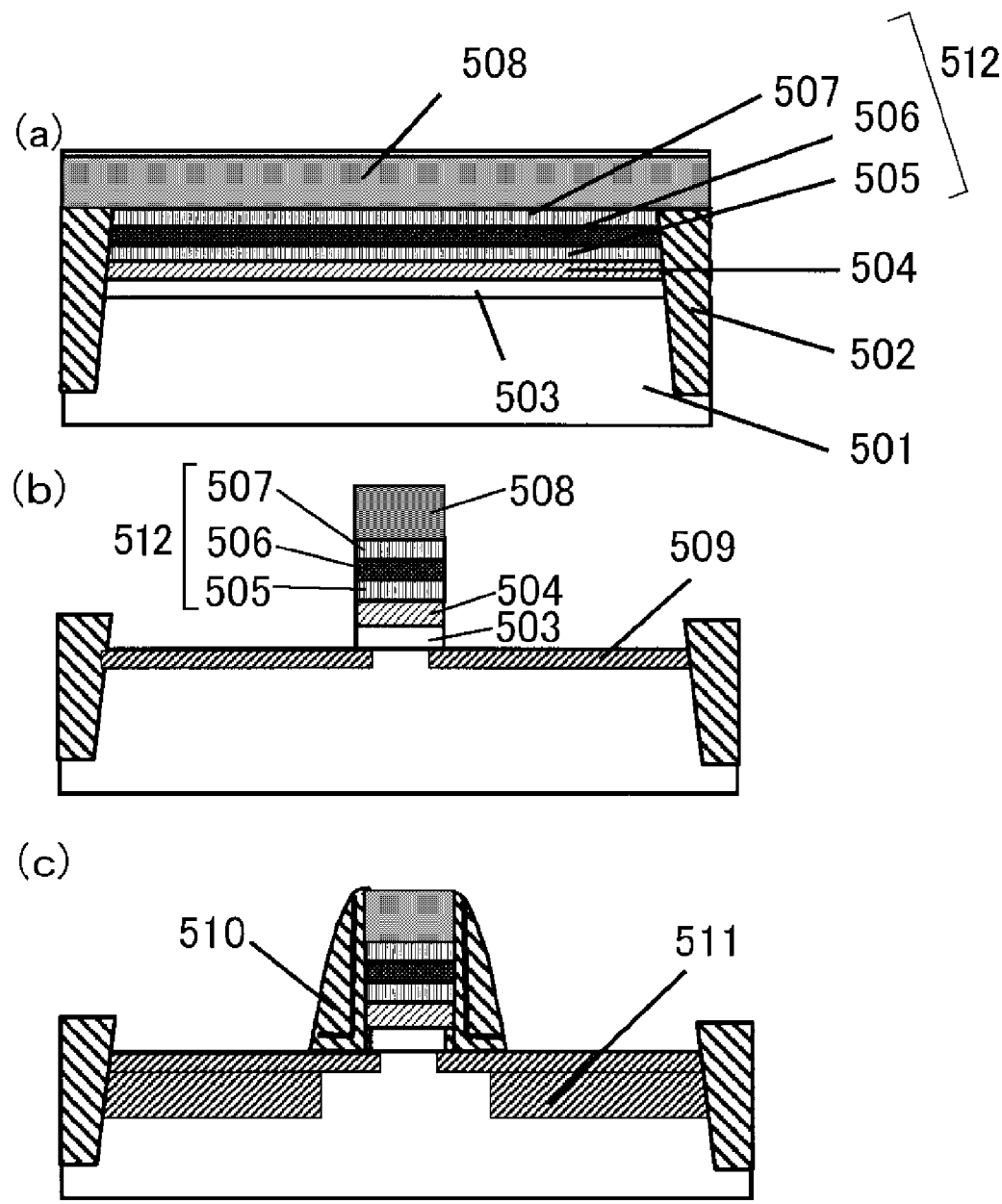
FIG. 16 is a diagram showing the steps of a method of manufacturing a semiconductor device in Example 3.

A gate electrode 405 of poly-Si with a thickness of 150 nm was then formed on the dielectric film 404. Thereafter, as shown in part (b) of FIG. 16, the gate electrode was processed using lithography and RIE techniques, and subsequently, an extension region 406 was formed in a self-aligned manner by ion implantation using the gate electrode as a mask.

As shown in FIG. 15(c), a silicon nitride film and a silicon oxide film were further sequentially deposited, and then a gate sidewall 407 was formed by etch-back. In this state, ion implantation was performed again, and activated annealing was performed, so that a source/drain region 408 was formed. It will be understood that the crystallization of the HfAlO film may be performed in the activated annealing process. In such a case, the annealing process for crystallization after the deposition of the HfAlO film may be omitted.

The electrical properties of the semiconductor device formed were evaluated. As a result, it has been demonstrated that an HfAlO film with an Al/(Hf+Al) molar ratio of $0.02 \leq (Al/(Hf+Al)) \leq 0.095$ formed as the dielectric film 404 can provide increased relative dielectric constant and reduced leakage current as compared with $HfO_2$ which does not contain Al. The annealed dielectric film 404 was measured by X-ray diffraction. As a result, the dielectric film 404 was found to have a crystal structure composed mainly of a cubic crystal.

According to this example, therefore, a semiconductor device with reduced gate-leakage current can be obtained by performing the dielectric film-forming method of the invention in the process of manufacturing a semiconductor device having an HfAlO film as part of a MOSFET gate insulating film. In this example, it has also been demonstrated that the same advantageous effect can be obtained when an HfZrAlO film, which contains Zr, is formed as the dielectric film 404. In this example, it has also been demonstrated that the same advantageous effect can be obtained when an HfSiO or HfZrSiO film, which contains Si, is formed as the dielectric film 404.

Example 3

Example Applied to Blocking Film of Nonvolatile Memory Device

FIGS. 16(a) to 16(c) are cross-sectional views showing the process of a third example of the invention for the manufacture of a semiconductor device.

As shown in FIG. 16(a), an isolation region 502 was first formed on the surface of a silicon substrate 501 using STI (Shallow Trench Isolation) technique. Subsequently, a silicon oxide film with a thickness of 30 Å to 100 Å was formed as a first insulating film 503 by thermally-oxidized film method on the isolated surface of the silicon substrate 501. Subsequently, a silicon nitride film with a thickness of 30 Å to 100 Å was formed as a second insulating film 504 by LPCVD (Low Pressure Chemical Vapor Deposition) method. Subsequently, an aluminum oxide film with a thickness of 5 Å to 50 Å was formed as a third insulating film 505. The aluminum oxide film may be formed using MOCVD method, ALD (Atomic Layer Deposition) method, or PVD (Physical Vapor Deposition) method. Subsequently, an HfAlO film with a thickness of 5 nm to 20 nm was formed as a fourth insulating film (dielectric film) 506 by the same method as in Example 1. Subsequently, an aluminum oxide film with a thickness of 5 Å to 50 Å was formed as a fifth insulating film 507. MOCVD method, ALD method, or PVD method was used to form the film. A laminate of the third insulating film 505, the fourth insulating film 506 and the fifth insulating film 507 serves as a blocking film 512.

After a poly-Si film with a thickness of 150 nm was formed as a gate electrode 508, the gate electrode was processed using lithography and RIE (Reactive Ion Etching) techniques as shown in FIG. 16(b), and subsequently, an extension region 509 was formed in a self-aligned manner by ion implantation using the gate electrode as a mask.

As shown in FIG. 16(c), a silicon nitride film and a silicon oxide film were further sequentially deposited, and then a gate sidewall 510 was formed by etch-back. In this state, ion implantation was performed again, and activated annealing was performed, so that a source/drain region 511 was formed.

The electrical properties of the semiconductor device formed were evaluated. As a result, it has been demonstrated that an HfAlO film with an Al/(Hf+Al) molar ratio of $0.02 \leq (Al/(Hf+Al)) \leq 0.095$ formed as the fourth insulating film 506 can provide increased relative dielectric constant and reduced leakage current as compared with $HfO_2$ which does not contain Al. The annealed fourth insulating film 506 was measured by X-ray diffraction. As a result, the film 506 was found to have a crystal structure composed mainly of a cubic crystal.

According to this example, therefore, a semiconductor device with reduced gate-leakage current can be obtained by performing the dielectric film-forming method of the invention in the process of manufacturing a semiconductor device having an HfAlO film as part of a blocking insulating film 512 of a MONOS type nonvolatile memory device. In this example, it has also been demonstrated that the same advantageous effect can be obtained when an HfZrAlO film, which contains Zr, is formed as the dielectric film 506. In this example, it has also been demonstrated that the same advantageous effect can be obtained when an HfSiO or HfZrSiO film, which contains Si, is formed as the dielectric film 506.

While a poly-Si film was used as the gate electrode 508 in this example, the same advantageous effect was obtained using TiN, TaN, W, WN, Pt, Ir, Pt, Ta, or Ti for the gate electrode 508.

In this example, the first insulating film 503, the second insulating film 504, the third insulating film 505, the fourth insulating film 506, and the fifth insulating film 507 were annealed by activated annealing after the ion implantation. Alternatively, the annealing may be performed after the formation of each insulating film.

In this example, a laminate of the third insulating film 505, the fourth insulating film 506 and the fifth insulating film 507 was used as the blocking film 512 of the nonvolatile semiconductor memory device. Alternatively, the same advantageous effect was obtained using a laminate of the third insulating film 505 and the fourth insulating film 506.

Example 4

Example Applied to FG Type Nonvolatile Semiconductor Device

A fourth example of the invention is described in detail with reference to the drawings.

Figure 17:
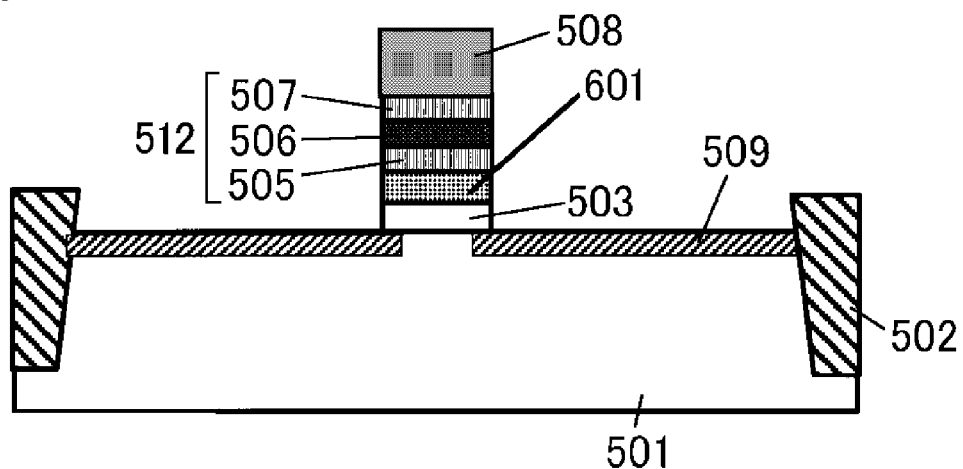
FIG. 17 is a diagram showing the cross-section of a semiconductor device in Example 4.

FIG. 17 shows a cross-sectional view of a semiconductor device according to the fourth example of the invention. This example is different from Example 3 in that a poly-Si layer serving as a floating electrode 601 is formed in place of the second insulating film 504 of the semiconductor device in Example 3. The process after the formation of the second insulating film 504 in Example 3 was used in the same manner.

The electrical properties of the semiconductor device formed were evaluated. As a result, it has been demonstrated that an HfAlO film with an Al/(Hf+Al) molar ratio of $0.02 \leq$ (Al/(Hf+Al))$\leq 0.095$ formed as the fourth insulating film 506 can provide increased relative dielectric constant and reduced leakage current as compared with $HfO_2$ which does not contain Al. The annealed fourth insulating film 506 was measured by X-ray diffraction. As a result, the film 506 was found to have a crystal structure composed mainly of a cubic crystal.

According to this example, therefore, a semiconductor device with reduced gate-leakage current can be obtained by performing the dielectric film-forming method of the invention in the process of manufacturing a semiconductor device having an HfAlO film as part of a blocking insulating film (inter-poly insulating film) 512 of a FG type nonvolatile memory device having an floating electrode 601. In this example, it has also been demonstrated that the same advantageous effect can be obtained when an HfZrAlO film, which contains Zr, is formed as the dielectric film 506. In this example, it has also been demonstrated that the same advantageous effect can be obtained when an HfSiO or HfZrSiO film, which contains Si, is formed as the dielectric film 506.

While a poly-Si film was used as the gate electrode 508 in this example, the same advantageous effect was obtained using TiN, TaN, W, WN, Pt, Ir, Pt, Ta, or Ti for the gate electrode 508.

In this example, the first insulating film 503, the second poly-Si layer 601, the third insulating film 505, the fourth insulating film 506, and the fifth insulating film 507 were annealed by activated annealing after the ion implantation. Alternatively, the annealing may be performed after the formation of each insulating film.

In this example, a laminate of the third insulating film 505, the fourth insulating film 506 and the fifth insulating film 507 was used as the blocking layer of the nonvolatile semiconductor memory device. Alternatively, the same advantageous effect was obtained using a laminate of the third insulating film 505 and the fourth insulating film 506.

DESCRIPTION OF REFERENCE NUMERALS

1 silicon substrate
2 silicon oxide film
3 dielectric film
4 TiN film
100 deposition process chamber
101 heater
102 substrate to be treated
103 substrate support
104 susceptor
105 heater
106, 126 metal target
107, 127 back plate
108, 128 target holder
109, 129 insulator
110, 130 DC power source
111, 131 magnet
112, 132 magnet holder
116 shielding plate
117 conductance valve
118 vacuum pump
201 inert gas source
202 valve
203 mass flow controller
204 valve
205 reactive gas source
206 valve
207 mass flow controller
208 a valve
301 silicon substrate
302 silicon oxide film
303 dielectric film
304 TiN film
401 silicon substrate
402 isolation region
403 silicon oxide film
404 dielectric film
405 gate electrode
406 extension region
407 gate sidewall
408 source/drain region
501 silicon substrate
502 isolation region
503 first insulating film
504 second insulating film
505 third insulating film
506 fourth insulating film (dielectric film)
507 fifth insulating film
508 gate electrode
509 extension region
510 gate sidewall
511 source/drain region
601 floating electrode

The invention claimed is:
1. A method for forming, on a substrate, a dielectric film comprising a metal oxide containing O and elements A and B, wherein the element A comprises Hf or a mixture of Hf and Zr and the element B comprises Al or Si, the method comprising the steps of:

forming a metal oxide having an amorphous structure which has a molar ratio between element A and element B, B/(A+B) of $0.02 \leq (B/(A+B)) \leq 0.095$ and a molar ratio between element A and O, O/A of $1.0 < (O/A) < 2.0$; and annealing the metal oxide having the amorphous structure at 700° C. or more to form a metal oxide containing a crystal phase including a cubic crystal.

2. The method for forming a dielectric film according to claim 1, wherein the step of forming the metal oxide having the amorphous structure comprises magnetron-sputtering a metal target containing a metal material for forming the metal oxide layer, under an atmosphere of a mixture of inert gas and reactive gas comprising oxygen in a vacuum chamber, at such a reactive gas feed rate that the molar ratio between element A and O, O/A in the metal oxide can fall within the range of $1.5 < (O/A) < 2.0$.

3. The method for forming a dielectric film according to claim 2, wherein the reactive gas feed rate is set to be equal to or less than a feed rate at which the rate of the reduction in the sputtering rate caused by oxidation of the surface of the metal target reaches the maximum.

4. The method for forming a dielectric film according to claim 2, wherein the pressure in the vacuum chamber is set at $1 \times 10^{-1}$ Pa or less.

5. The method for forming a dielectric film according to claim 1, wherein the dielectric film has a relative dielectric constant of 40 or more.

6. A method for manufacturing a semiconductor device having a dielectric film as an insulating film, comprising forming the dielectric film by the method according to claim 1.

7. A method for manufacturing a nonvolatile semiconductor device comprising a substrate at least a surface of which comprises a semiconductor layer, a gate electrode formed on the substrate, and laminated gate insulating films sequentially laminated between the substrate and the gate electrode, the method comprising forming at least one of the laminated gate insulating films by the method according to claim 1.

8. A method for manufacturing a nonvolatile semiconductor device comprising a substrate at least a surface of which comprises a semiconductor layer, a gate electrode formed on the substrate, and a structure having a first insulating film, a floating electrode and a second insulating film sequentially laminated between the substrate and the gate electrode, the method comprising forming at least one of the insulating films between the gate electrode and the substrate by the method according to claim 1.

9. A method for manufacturing a semiconductor device comprising a substrate at least a surface of which comprises a semiconductor layer, source and drain regions formed on the substrate, and a gate electrode formed on the substrate with an insulating film interposed therebetween, the method comprising forming the insulating film by the method according to claim 1.

10. The method for forming a dielectric film according to claim 1, wherein the metal oxide containing the crystal phase contains the crystal phase with a cubic crystal content of 80% or more.

11. A non-transitory computer readable recording medium having a manufacturing program of a dielectric film for forming, on a substrate, a dielectric film comprising a metal oxide containing O and elements A and B, wherein the element A comprises Hf or a mixture of Hf and Zr and the element B comprises Al or Si, wherein the program causes a computer to execute the processes of:

forming a metal oxide having an amorphous structure which has a molar ratio between element A and element B, B/(A+B) of $0.02 \leq (B/(A+B)) \leq 0.095$ and a molar ratio between element A and O, O/A of $1.0 < (O/A) < 2.0$; and annealing the metal oxide having the amorphous structure at 700° C. or more to form a metal oxide containing a crystal phase with a cubic crystal content of 80% or more.

12. A non-transitory computer readable recording medium having a manufacturing program of semiconductor device for manufacturing a semiconductor device having a dielectric film comprising a metal oxide containing O and elements A and B as an insulating film, wherein the element A comprises Hf or a mixture of Hf and Zr and the element B comprises Al or Si, wherein the program causes a computer to execute the processes of:

forming a metal oxide having an amorphous structure which has a molar ratio between element A and element B, B/(A+B) of $0.02 \leq (B/(A+B)) \leq 0.095$ and a molar ratio between element A and O, O/A of $1.0 < (O/A) < 2.0$; and annealing the metal oxide having the amorphous structure at 700° C. or more to form a metal oxide containing a crystal phase with a cubic crystal content of 80% or more.

* * * * *